United States Patent
Lin et al.

(10) Patent No.: US 10,707,344 B2
(45) Date of Patent: Jul. 7, 2020

(54) POWER MOSFET WITH METAL FILLED DEEP SOURCE CONTACT

(71) Applicant: Texas Instruments Incorporated, Dallas, TX (US)

(72) Inventors: Furen Lin, Chengdu (CN); Frank Baiocchi, Allentown, PA (US); Yunlong Liu, Chengdu (CN); Lark Liu, Chengdu (CN); Tianping Lv, Chengdu (CN); Peter Lin, Chengdu (CN); Ho Lin, Chengdu (CN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/817,488

(22) Filed: Nov. 20, 2017

(65) Prior Publication Data

US 2018/0076320 A1    Mar. 15, 2018

Related U.S. Application Data

(60) Division of application No. 15/171,136, filed on Jun. 2, 2016, now Pat. No. 9,853,144, which is a
(Continued)

(51) Int. Cl.
*H01L 29/66* (2006.01)
*H01L 29/78* (2006.01)
(Continued)

(52) U.S. Cl.
CPC ........ *H01L 29/7816* (2013.01); *H01L 21/743* (2013.01); *H01L 29/0696* (2013.01);
(Continued)

(58) Field of Classification Search
CPC ........... H01L 29/7816; H01L 29/66696; H01L 29/0696; H01L 29/407; H01L 29/66659;
(Continued)

(56) References Cited

U.S. PATENT DOCUMENTS 5,869,875 A   2/1999  Hebert
6,136,707 A  10/2000  Cohen
(Continued)

FOREIGN PATENT DOCUMENTS

CN   103545370 A   1/2014

OTHER PUBLICATIONS

International Search Report, PCT No. PCT/CN2016/071188, dated Oct. 19, 2016 (1 page).
(Continued)

*Primary Examiner* — Jarrett J Stark
(74) *Attorney, Agent, or Firm* — Jacqueline J. Garner; Charles A. Brill; Frank D. Cimino

(57) ABSTRACT

A planar gate power MOSFET includes a substrate having a semiconductor surface doped a first conductivity type, a plurality of transistor cells (cells) including a first cell and at least a second cell each having a gate stack over a body region. A trench has an aspect ratio of >3 extending down from a top side of the semiconductor surface between the gate stacks providing a source contact (SCT) from a source doped a second conductivity type to the substrate. A field plate (FP) is over the gate stacks that provides a liner for the trench. The trench has a refractory metal or platinum-group metal (PGM) metal filler within. A drain doped the second conductivity type is in the semiconductor surface on a side of the gate stacks opposite the trench.

20 Claims, 6 Drawing Sheets

Related U.S. Application Data continuation of application No. PCT/CN2016/071188, filed on Jan. 18, 2016.

(51) Int. Cl.

| | | |
|---|---|---|
| *H01L 29/40* | (2006.01) | |
| *H01L 29/417* | (2006.01) | |
| *H01L 21/74* | (2006.01) | |
| *H01L 29/06* | (2006.01) | |
| *H01L 29/10* | (2006.01) | |

(52) U.S. Cl.
CPC ........ *H01L 29/1087* (2013.01); *H01L 29/402* (2013.01); *H01L 29/407* (2013.01); *H01L 29/4175* (2013.01); *H01L 29/66659* (2013.01); *H01L 29/66696* (2013.01); *H01L 29/7835* (2013.01)

(58) Field of Classification Search
CPC ............ H01L 29/7835; H01L 29/1087; H01L 21/82345; H01L 21/823456; H01L 21/823462; H01L 21/8236; H01L 21/823842; H01L 21/82385; H01L 21/823857; H01L 27/0617–0623; H01L 27/0635; H01L 27/0705–0722; H01L 27/085–098; H01L 27/105–11597

See application file for complete search history.

(56) References Cited

U.S. PATENT DOCUMENTS

| | | | |
|---|---|---|---|
| 6,521,923 | B1 | 2/2003 | D'Anna et al. |
| 7,078,312 | B1 | 7/2006 | Sutanto et al. |
| RE42,403 | E | 5/2011 | Babcock et al. |
| 8,597,998 | B2 | 12/2013 | Bhalla et al. |
| 8,829,613 | B1 | 9/2014 | Pendharkar et al. |
| 2003/0052384 | A1 | 3/2003 | Sato et al. |
| 2003/0116785 | A1 | 6/2003 | D'Anna et al. |
| 2006/0038224 | A1 | 2/2006 | Shibib et al. |
| 2006/0180855 | A1 | 8/2006 | Bhalla et al. |
| 2006/0209887 | A1 | 9/2006 | Bhalla et al. |
| 2006/0273385 | A1 | 12/2006 | Hshieh |
| 2007/0034942 | A1 | 2/2007 | Xu et al. |
| 2007/0190728 | A1 | 8/2007 | Sreekantham et al. |
| 2007/0298607 | A1 | 12/2007 | Andryushchenko et al. |
| 2010/0216290 | A1 | 8/2010 | Lin et al. |
| 2010/0255677 | A1 | 10/2010 | Miura |
| 2010/0291767 | A1 | 11/2010 | Miura |
| 2011/0014766 | A1 | 1/2011 | Hebert |
| 2011/0037120 | A1 | 2/2011 | Chen et al. |
| 2012/0012956 | A1 | 1/2012 | Saitoh et al. |
| 2012/0032262 | A1 | 2/2012 | Toren et al. |
| 2012/0309191 | A1 | 12/2012 | Miura |
| 2013/0193502 | A1 | 8/2013 | Kocon et al. |
| 2014/0034999 | A1 | 2/2014 | Korec |
| 2014/0035032 | A1 | 2/2014 | Korec et al. |
| 2014/0035102 | A1 | 2/2014 | Korec et al. |
| 2014/0284701 | A1 | 9/2014 | Korec |
| 2015/0221735 | A1 | 8/2015 | Joshi et al. |
| 2015/0243779 | A1 | 8/2015 | Terrill |
| 2016/0218008 | A1 | 7/2016 | Li et al. |
| 2016/0359040 | A1 | 12/2016 | Kumar et al. |

OTHER PUBLICATIONS

Cheon Soo Kim et al., "Trenched Sinker LDMOSFET (TS-LDMOS) Structure for High Power Amplifier Application above 2 GHz", Dec. 2, 2001, pp. 887-890, IEEE, US.

European Patent Office Search Report, dated Jan. 7, 2019, PCT/CN2016071188.

POWER MOSFET WITH METAL FILLED DEEP SOURCE CONTACT

CROSS REFERENCE TO RELATED APPLICATIONS

This application is a divisional of U.S. Nonprovisional patent application Ser. No. 15/171,136, filed Jun. 2, 2016, which is a continuation of International Application No. PCT/CN2016/071188 entitled "POWER MOSFET WITH METAL FILLED DEEP SOURCE CONTACT", with an international filing date of Jan. 18, 2016, which designated the United States, the contents of both of which are herein incorporated by reference in its entirety.

FIELD

Disclosed embodiments relate to planar gate power semiconductor devices.

BACKGROUND

For power field effect transistors (FETs) lower specific ON-resistance (RSP) is generally the trend for improving the performance including raising the power conversion efficiency. One such power device is a planar gate trench metal oxide semiconductor FET, such as the Texas Instruments' NEXFET™.

The NEXFET™ is derived from a structure resembling a laterally diffused metal oxide semiconductor (LDMOS) transistor that can be used for RF signal amplification in a frequency range up to about 2 GHz. In an LDMOS device, the drain is laterally arranged to allow current to laterally flow, and a drift region is interposed between the channel and the drain to provide a high drain to source breakdown voltage.

For the NEXFET™ to achieve higher dynamic performance, the Miller capacitance is reduced to single picofarads by having the overlap of the gate electrode over the lightly doped drain extension (LDD) kept to a minimum. Additionally, the NEXFET™ has a topology with the source metal wrapping the gate electrode and creating a field-plate element over the LDD region making an effective electrostatic shield between the gate and drain terminals of the device. The field-plate created by the source metal also stretches out the distribution of the electric field along the LDD surface. This field plate feature lowers the height of the electric field peak at the drain corner of the gate electrode. By doing so, the hot-carrier effects creating reliability issues in conventional LDMOS devices are avoided.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments begin with the NEXFET™ planar gate power field effect transistor (FET) design described above and modify it including by changing the source contact from an aluminum to silicon contact at a surface of the source to a metal (e.g., W) filled deep source contact (deep SCT) within an epitaxial (epi) layer on the substrate or into the substrate itself. The deep SCT simultaneously ohmically contacts the source and the substrate of the device, which are doped opposite types to each other. The metal (e.g., W) filled deep SCT is recognized to reduce the SCT parasitic resistance as well as the area-normalized ON state resistance (RSP) of the power FET. The deep SCT generally has a high aspect ratio (AR), such as having a 0.4 μm critical dimension (CD) opening between gate stacks that provide self-alignment for the source, and is at least 1.2 μm deep (including the gate stack) so that the AR of the deep SCT is 3:1 or more. The CD of the deep SCT may be about 0.3 μm or less, and a total depth about 1.5 μm (including gate stack thickness of about 0.5 μm) leading to a trench AR of about 5:1.

Disclosed embodiments self-align using the gate stack to form the deep SCT to improve performance, and recognized this makes it difficult to obtain a tapered SCT profile formed into an epitaxial (epi) layer on the substrate (or the substrate) needed for a SCT that is electrically isolated from the drain and of low resistance. After forming the trench, a field plate (FP) is formed over the gate stacks which is electrically coupled to the deep SCT by the FP material (e.g., a refractory metal liner) lining the SCT.

A trench AR of at least 3:1, such as about 5:1 in one particular embodiment, is recognized herein to result in a significant challenge for a single metal (e.g., W) deep SCT fill and etch process. The challenges include metal fill and etch back processing to form the deep SCT without any metal residue over the FPs (which can cause leakage or shorting between the source (as it is connected to the FP) and the drain contact, as well as avoiding a metal seam (void region) in the SCT which adds parasitic resistance as well as to the RSP.

Disclosed embodiments include methods of fabricating power planar gate trench metal oxide semiconductor FET (power MOSFETs) including providing at least one MOSFET die including a plurality of transistor cells (cells) including a first cell and at least a second cell formed on a substrate (e.g., on a wafer) having a semiconductor surface (e.g., epi) doped a first conductivity type. The first cell has a first gate stack and the second cell has a second gate stack. Each gate stack includes a gate electrode on a gate dielectric over a body region, a trench having an AR of at least 3 extending down from a top side of the semiconductor surface between the first and second gate stack.

A FP is over each gate stack extending to provide a liner for the trench. The trench has a metal filler within comprising a refractory metal. A drain doped the second conductivity type in the semiconductor surface is on a side of the gate stacks opposite the trench. First etching of the metal filler removes metal filler along a sidewall of the FP and over the drain and removes a portion of the metal filler in the trench. A metal filler deposition fills the trench, and a second etching of the metal filler completes the deep SCT.

BRIEF DESCRIPTION OF THE DRAWINGS

Reference will now be made to the accompanying drawings, which are not necessarily drawn to scale, wherein.

DETAILED DESCRIPTION

Figure 1:
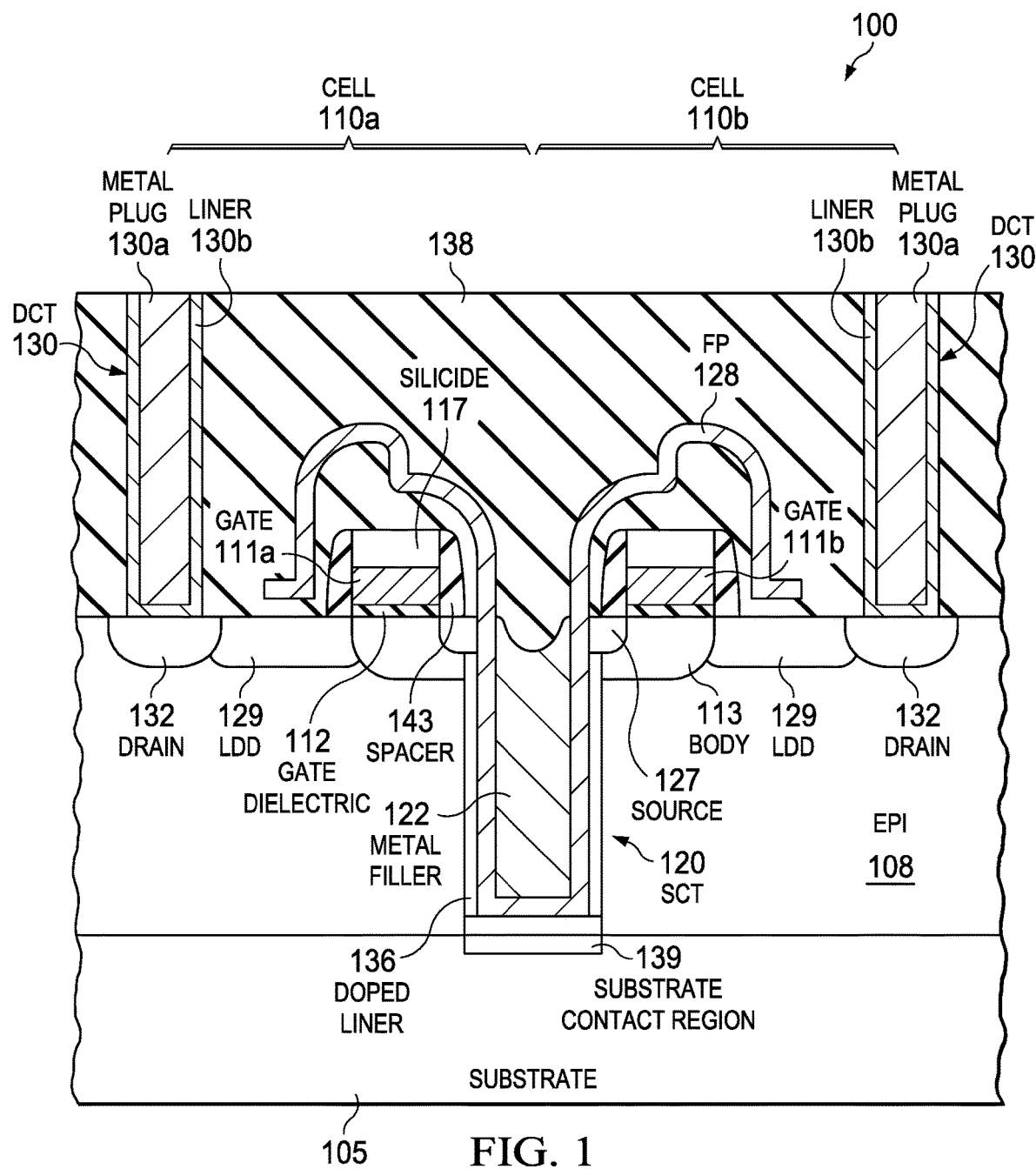
FIG. 1 is a cross-sectional diagram showing a portion of an example power MOSFET having a metal filled deep SCT, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a cross-sectional diagram showing a portion of an example planar gate power MOSFET (power MOSFET) 100 having a metal filled deep SCT 120, described as being an n-channel MOSFET having tungsten as the refractory or a platinum-group metal (PGM) filler (metal filler 122), according to an example embodiment. As known in material science, the identifying feature of refractory metals is their resistance to heat, where the five industrial refractory metals (Molybdenum (Mo), Niobium (Nb), Rhenium (Re), Tantalum (Ta) and Tungsten (W)) all have melting points in excess of 2000° C., with tungsten having a melting point of 3422° C. PGMs include Iridium (Ir), Osmium (Os), Palladium (Pd), Platinum (Pt) and Rhodium (Rh). Pt and Pd have melting points of 1,769° C. and 1,554° C., respectively. Such melting points may be compared to Aluminum (Al) (not a refractory metal or a PGM) which has a melting point of only 660° C., and is thus not suitable for being the metal for a disclosed metal filled deep SCT 120.

Disclosed MOSFETs have a form that resembles an LDMOS device. As used herein, an LDMOS device is synonymous with a diffused metal oxide semiconductor (DMOS) device. Besides tungsten (W), the metal filler 122 may also comprise other refractory metals such as Ta, or a PGM such as Pt or Pd, their metal silicides, or metal alloys of such metals including Ti—W.

Although NMOS transistors are generally described herein, it should be clear to one having ordinary skill in the art to use this information disclosed herein to also form PMOS transistors, by n-doped regions being substituted by p-doped regions and vice versa as in either case, the structure is analogous. For example, the metal filled deep trench in the semiconductor (e.g., silicon) would be the deep SCT, and the metal filled plug in the dielectric stack (generally connecting to Met1) would be the drain contact (DCT). The difference in disclosed PMOS vs. NMOS power MOSFET devices involves using opposite type doping, e.g. a p/p+ substrate for NMOS becomes an n/n+ substrate for PMOS, the S/D goes from n-type for NMOS to p-type doping for PMOS, and the body region goes from p-type for NMOS to n-type for PMOS. Disclosed method of forming the deep SCT with refractory metal (e.g., W) or PGM fill can thus be applied to both PMOS and NMOS.

Power MOSFET 100 includes a semiconductor surface shown as an epi layer 108 on a substrate 105. The substrate 105 and/or epi layer 108 can comprise silicon, silicon-germanium, or other semiconductor material. However, MOSFET 100 can be formed directly on a substrate 105, such as a substrate comprising bulk silicon with an appropriate doping concentration. One embodiment comprises an epi layer 108 that is lightly doped and with an epi layer thickness designed to increase the device breakdown voltage, on a more heavily doped substrate 105, which is contacted by adjustment of the SCT trench depth.

Power MOSFET 100 includes a drain 132 having a drain contact (DCT) 130. DCT 130 comprises a metal plug 130a with barrier metal liner 130b (e.g., Ti/TiN). Surrounding and coupled to the deep SCT 120 is a source 127 which is generally formed by ion implantation that the deep SCT 120 provides a low resistance contact to. The deep SCT 120 connects the source 127 to the epi layer 108 or substrate 105 via a highly doped substrate contact region 139 (doped p+ for p-type substrates) at a bottom of the deep SCT 120 (optionally through a thin region of epi layer 108) so that during operation when the power MOSFET 100 is turned ON current can flow vertically down and out the back of the substrate 105 (die) with minimal resistance.

To the external circuit, the backside of the substrate 105 is generally the source pin, and the top side metal (that will be on top of the dielectric layer(s) 138 and extending into a drain contact through the dielectric layer 138 to the drain 132) is the drain pin. The FP 128 of the deep SCT 120 makes an ohmic contact to the source 127 at the top corner of the trench of the deep SCT 120. It is recognized that a polysilicon filled deep SCT trench, for example, would not allow the power MOSFET 100 to function properly because there would be a semiconductor diode junction formed between the source 127 and substrate 105 as they are doped opposite types (e.g., n+ doped source 127 and the p+ doped substrate 105 and epi layer 108). The refractory metal or PGM filled SCT 120 thus straps n+ regions and p+ regions (opposite types) together in a low resistance ohmic connection to allow the power MOSFET 100 to function properly.

As noted above, at the bottom of the deep SCT 120 is a substrate contact region 139 that is generally an implanted region formed after the etching of the trench for the deep SCT 120 which is doped the same type as the epi layer 108. The boron doping level for substrate contact region 139 can be around $1\times10^{20}$ cm$^{-3}$ (e.g., $5\times10^{19}$ cm$^{-3}$ to $1\times10^{21}$ cm$^{-3}$) to provide a low resistance ohmic contact to the substrate 105. Two transistor cells 110a and 110b are shown that function as power MOSFET device building blocks, each being defined from the midpoint of the deep SCT 120 to the midpoint of the DCT 130. However, a practical power MOSFET device may be considered a 2D transistor array as there may be hundreds or thousands of individual active transistor cells hooked together electrically in parallel. A 2D transistor array to form the power MOSFET device is generally built up in circuit design by repetitive mirror images of the unit cells 110a, 110b.

Although not shown in FIG. 1, the respective gate electrodes 111a and 111b (shown having an optional silicide layer 117 thereon) of the active transistor cells 110a, 110b are separately electrically tied together by another metal or doped polycrystalline element (not shown) which is generally connected to the gate electrode terminal of the device package. As the transistor array is generally built up by repetitive mirror images of this unit cell, one DCT 130 shares two gates on either side, just as one deep SCT 120 shares two gates on either side.

There is a dielectric layer(s) 138 above the FP 128, such as a dielectric stack comprising one or more deposited silicon oxide layers (e.g., Tetraethyl Orthosilicate (TEOS) derived, boron and phosphorous doped TEOS (BPTEOS)/ TEOS). Dielectric layer 138 can be the result from standard interlevel dielectric processing (deposition/etching).

There is a hard mask material (e.g., silicon nitride or TEOS-derived silicon oxide layer) on the silicide layer 117 (under FP 128) which is on the gate electrodes 111a and 111b, where the silicide layer 117 reduces the gate resistance (Rg), and which can also be helpful for a disclosed deep SCT etching process. The remaining dielectric material over and around the gate stack shown as dielectric layer 138 can be a deposited dielectric layer such as a TEOS-derived silicon oxide layer. The gate stacks are shown including optional sidewall spacers 143.

The FP 128 is provided including over the gate stacks and extending over the LDDs 129 to provide control of the electric field shielding effect around the LDD 129 side of the gates. The FP 128 can comprise a refractory metal material layer or refractory metal material layer stack such as TiN/Ti. The refractory metal material is also present at the bottom of the deep SCT 120. There is an rapid thermal anneal (RTA) step that can be performed after TiN/Ti deposition which for a silicon epi layer 108 leads to titanium silicide formation at the Ti/Si interface. This, in addition to a proper (sufficiently high) doping concentration, is important for good ohmic contact between the deep SCT 120 and the epi layer 108 (or substrate 105).

As described above, a good ohmic contact is also needed at the top silicon surface to the source 127 of the power MOSFET 100. For power MOSFET 100 which is described as being NMOS, the deep SCT 120 being a metal filled trench provides the low resistance connection between the source 127 (which is n doped) and the epi layer 108 or substrate 105 (which are both p doped). As described above, for a PMOS transistor, opposite doping would be used, but this part of the device would still be the source side.

For device robustness, there is also a need to reduce the resistance between the p-doped body region 113 and the substrate 105 or epi layer 108. That is the purpose of the tilted implant into the sidewall region of the trench to form the doped liner 136 as shown in FIG. 1. The tilted trench implant utilizes the first conductivity type, being p-type for power MOSFET 100 as it is an NMOS device. Typical implant parameters for the tilted implant include boron, a dose range from $1 \times 10^{14}$ to $5 \times 10^{15}$ cm$^{-2}$, an energy range from 20 keV to 60 keV, and an angle range from 5 to 25 degrees. Power MOSFET 100 is also shown including lightly doped drains (LDDs) 129 that provide the drain extension side of the gates.

One feature believed to be unique for disclosed power MOSFETs is a metal filled deep SCT 120 extending down to provide a low resistance contact to the epi layer 108 or the substrate 105 as well as to the source 127. Another unique feature is believed to be an interface layer between the respective metal fill (e.g., tungsten (W)) layers, such as due to a precursor step in the chemical vapor deposition (CVD) tungsten deposition process that flows pure silane (SiH$_4$) for a period of time to prepare the surface for the CVD tungsten process. As a result, the interface layer generally comprises a thin layer (e.g., a few nms) of tungsten silicide (WSi$_2$).

Figure 2:
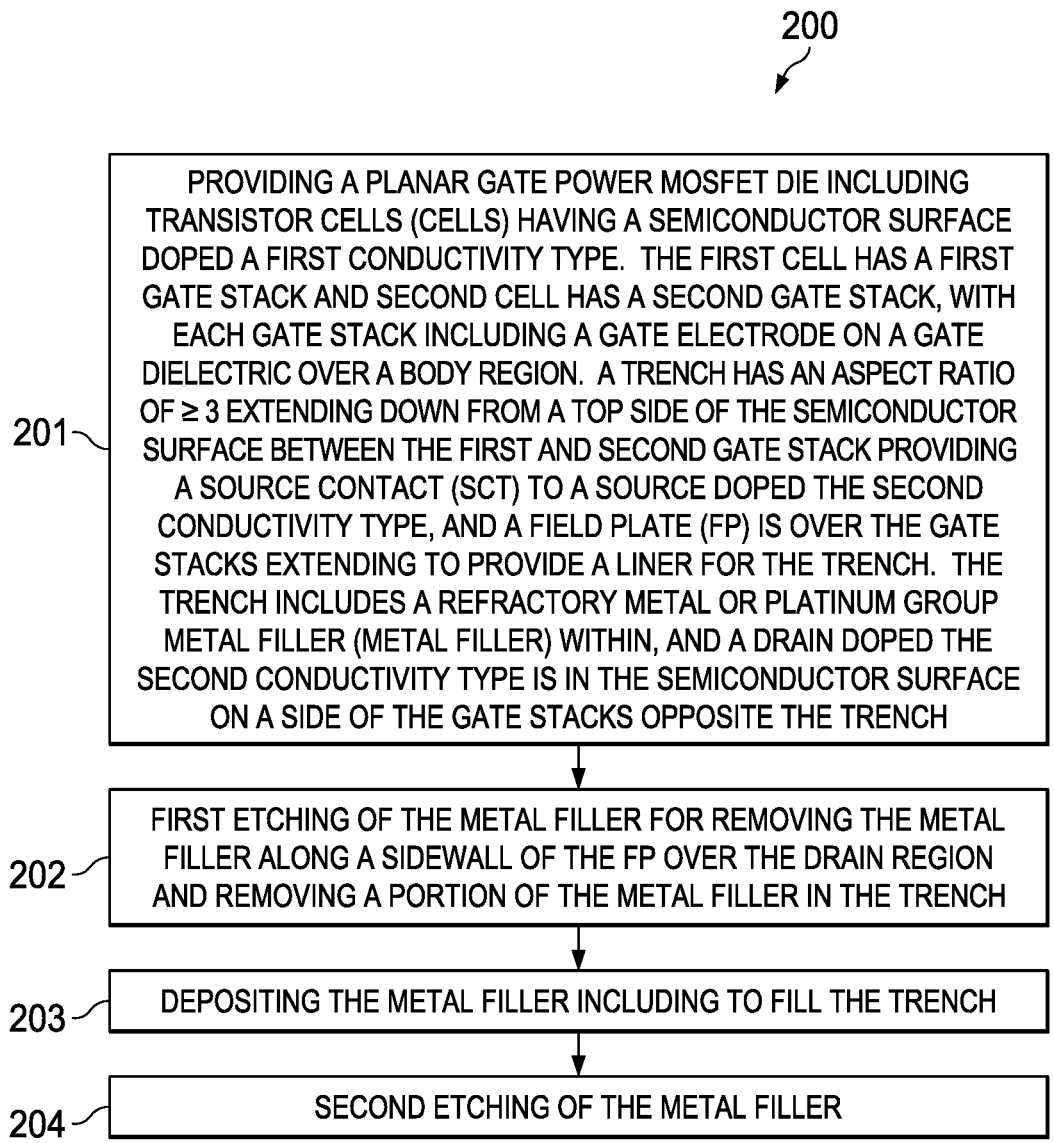
FIG. 2 is a flow chart that shows steps in an example double metal filler deposition/etchback method for forming deep SCTs for a power MOSFET, according to an example embodiment.

FIG. 2 is a flow chart that shows steps in an example double metal filler deposition/etch back method 200 for fabricating a power MOSFET, such as the power MOSFET 100 shown in FIG. 1, according to an example embodiment. Step 201 comprises providing a power MOSFET die including a plurality of transistor cells (cells) including a first cell 110a and at least a second cell 110b formed on a substrate 105 (e.g., on a wafer) having a semiconductor surface such as epi layer 108 doped a first conductivity type. The first cell has a first gate stack and second cell has a second gate stack, with each gate stack including a gate electrode 111a, 111b on a gate dielectric 112 over a body region 113.

A trench has an AR of at least (≥) 3 extending down from a top side of the semiconductor surface between the first and second gate stack providing a deep SCT 120 to a source doped the second conductivity type, and a FP 128 is over the gate stacks extending to provide a liner for the trench. The trench includes a metal filler (e.g., W) 122 within. A drain 132 doped the second conductivity type is in the semiconductor surface (such as epi layer 108) on a side of the gate stacks opposite the trench.

Step 202 comprises first etching of the metal filler 122 for removing the metal filler along a sidewall of the FP 128 over the drain 132 and removing a portion of the metal filler 122 in the trench. Plasma etching can be used for step 202 and step 204 described below. As known in the art of semiconductor etching, plasma etching involves a controlled glow discharge (plasma) of an appropriate gas mixture which is in contact with a sample, and where the plasma source continually provides reactive etch species which can be either charged (ions) or neutral (atoms and radicals), that remove solid material from the sample.

Step 203 comprises depositing metal filler 122 including to fill the trench. CVD or plasma enhanced CVD (PECVD) may be used to deposit a refractory metal such as tungsten or a PGM filler. Step 204 comprises second etching of the metal filler 122.

The double metal fill and etch back processes disclosed herein solve the W residue issue for power MOSFETs without any negative side effect. The fill metal (e.g., W) residue elimination at FP foot is helpful as it increases the distance from the DCT boundary to FP boundary (which is connected to the source), and reduces the possibility of FP bridging to the DCT. The disclosed combination of the double metal fill deposition and etchback process flow with disclosed metal fill also simultaneously removes the metal fill from high topography areas on the power MOSFET die while leaving the metal fill material within the deep SCT features. As shown in the Examples described below, with implementation of the disclosed double W deposition and etch back processing, the power MOSFET multi-probe yield was found to be significantly improved and became stable (from 50% to about 85% to being consistent and generally over 90%, see FIG. 4 described below).

Figure 3A:
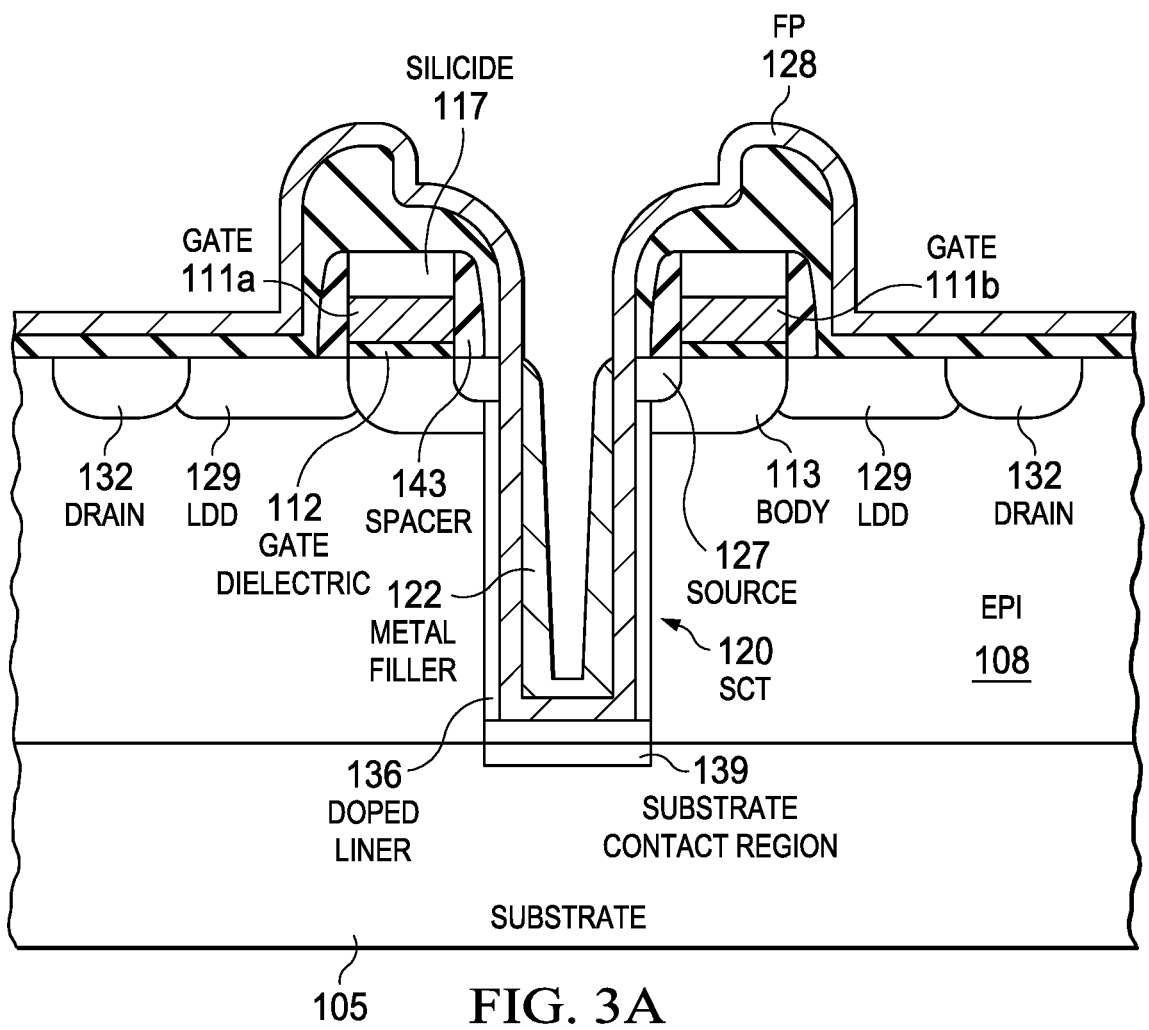
FIG. 3A-C show enhanced scanned depictions of cross sections of 2 gate stacks having a deep SCT in between that is connected to a FP which is over the gate stacks obtained from scanning electron microscope (SEM) images of a portion of a disclosed power MOSFET that evidences W residue is successfully removed at the sidewall of the FP in the drain region, and there is no W seam formed in the deep SCT region.
Figure 3B:
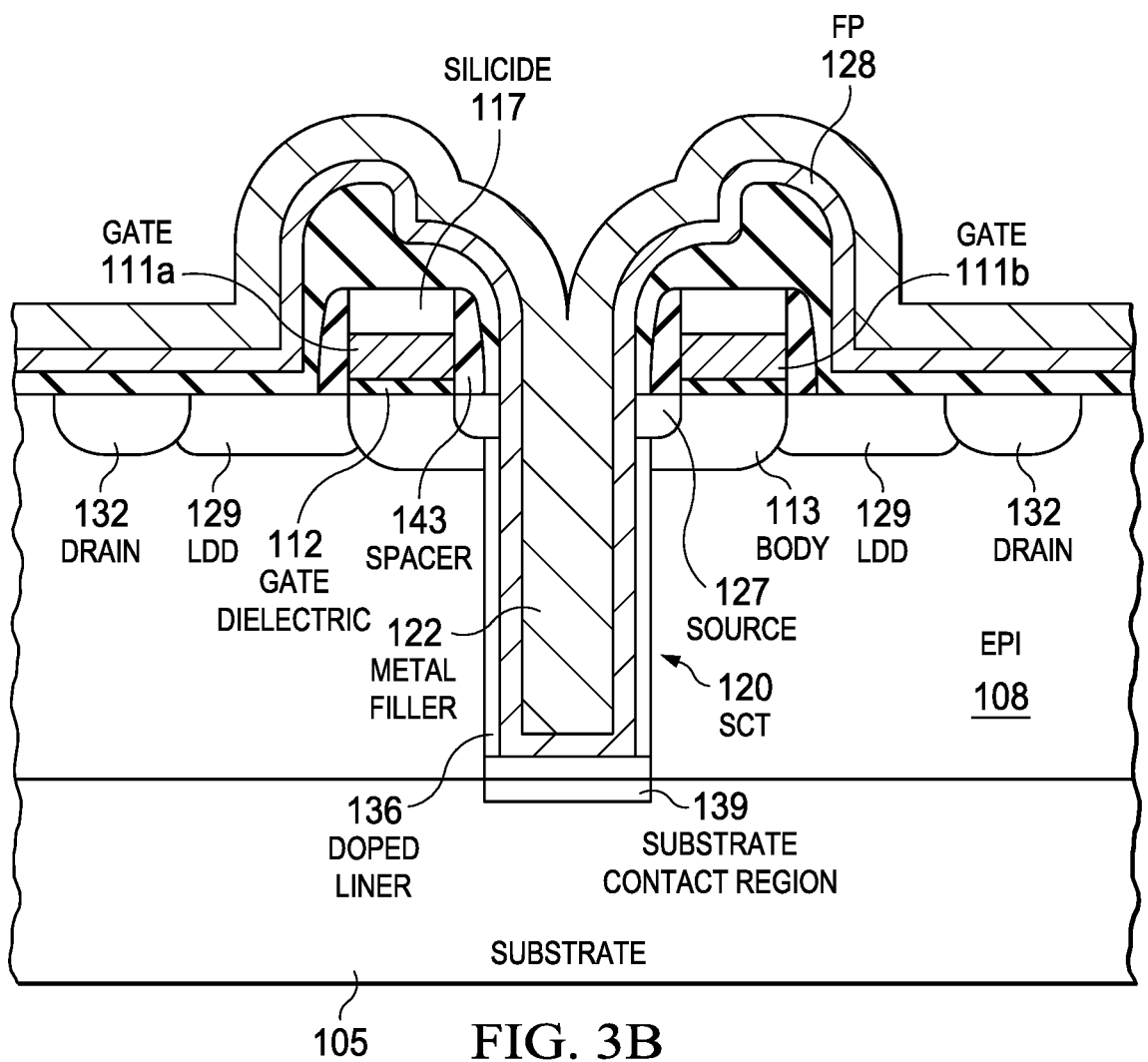
Figure 3C:
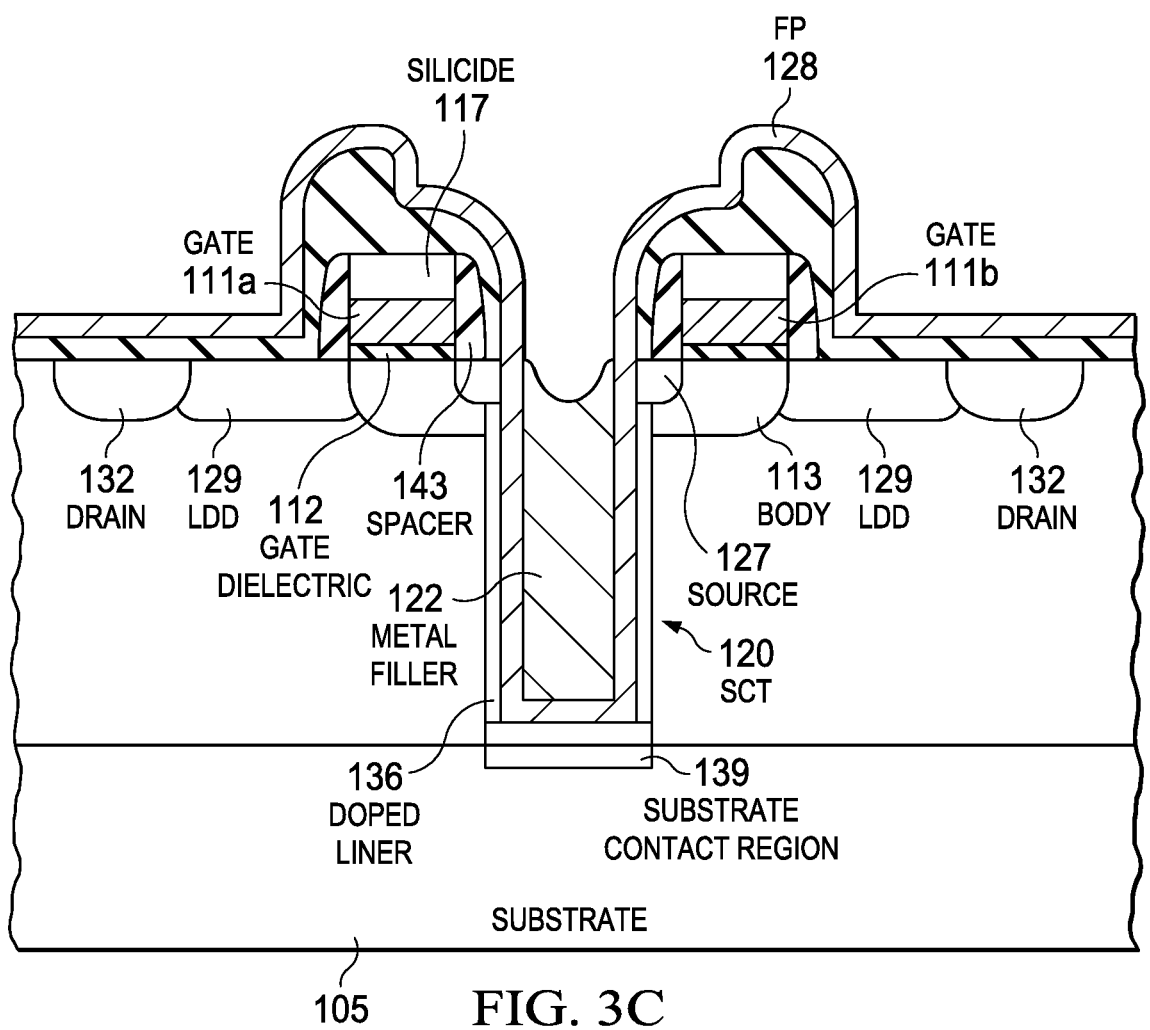

FIGS. 3A-C shows enhanced scanned depictions of cross sections obtained from SEM images of 2 gate stacks having a deep SCT 120 in between that is connected to a FP 128 which is over the gate stacks that evidences that not only the W metal filler 122 residue is successfully removed at the sidewall of the FP 128 next to the drain 132, but there is also no detectable W seam formed in the metal filler 122 of the deep SCT 120. The first W etch-back (step 202) provides a tapered deep SCT profile as shown in FIG. 3A, which is recognized to be helpful for the second W deposition.

Instead of a 90 degree angle from horizontal surface, the taper provides an angle that may be about 87 to 89 degrees from the horizontal surface. Because of the taper of the tungsten filler (shown as metal filler 122) provided by the first W etchback the second W deposition fills better with no seam being formed. This means the second etchback process can proceed for a longer time to clear the areas of topography above without removing material within the deep SCT 120.

As shown in FIG. 3B, after the second W metal filler 122 deposition (step 203), there is no visible metal filler 122 seam in the deep SCT 120. As shown in FIG. 3C, after the second W etch-back (e.g., using a high temperature recipe (e.g., 50° C.)) corresponding to step 204, the W metal filler 122 residue is removed at the FP sidewall over the LDD 129, next to the drain 132. The resulting structure depicted as power MOSFET 100 in FIG. 1 as shown above has no evidence of W metal filler 122 residue at the FP 128 which increases the distance from the boundary of the later formed DCT 130 to the drain 132 (where DCT 130 as described above comprises a metal plug 130a with barrier metal liner 130b (e.g., Ti/TiN)) to the boundary of the FP 128 (where the FP 128 is tied to the source 127), which thus reduces the possibility of the W metal filler 122 bridging the FP 128 to the DCT 130.

EXAMPLES

Disclosed embodiments are further illustrated by the following specific Examples, which should not be construed as limiting the scope or content of this Disclosure in any way.

Method 200 providing a double metal filler deposition/etch back was implemented for several completed wafer lots of planar gate power MOSFETs. The starting wafer comprised a p-epi layer on p+ bulk silicon substrate. The gate electrode comprised $WSi_2$ as the silicide layer 117 on polysilicon as the gate electrodes 111a, 111b. The gate dielectric comprised 175 Angstroms of silicon oxide ($SiO_2$). The trench was about 1.5 μm deep including a 0.5 μm tall gate stack, and the trench opening CD was about 0.3 μm. The trench was lined with FP material comprising 800 A of TiN on 600 A of Ti.

This FP 128 extended into and coated the sidewall of the deep SCT 120. However, the TiN/Ti material by itself is recognized to not be sufficient alone to provide a low resistance path from the source 127 to the epi-layer 108 or substrate 105. The deep SCT 120 and DCT 130 were both filled with CVD deposited tungsten. The tungsten etchback etch comprised a 3-step plasma etch, with the process gas comprising $SF_6/O_2/N_2$, a pressure of 30 mtorr to 35 mtorr, a plasma source power being 650 W~800 W, Bias power 25~35 W; and the temperature of the chamber wall of 50° C. and the temperature of the electrostatic chuck (ESC) was 30° C. All above etch parameters have a tolerance of at least 10%.

The process used for the first tungsten etchback etch (step 202) was the following:
Step 1: 30 mtorr/0 Ws/0 Wb/40 $O_2$/20 $N_2$/300 $SF_6$/8 He/Stable.
Step 2: 30 mtorr/800 Ws/35 Wb/40 $O_2$/20 $N_2$/300 $SF_6$/8 He/Endpoint time (Max 40 s)
Step 3: 35 mtorr/650 Ws/25 Wb/20 $N_2$/400 $SF_6$/8 He/30 s Chamber Wall: 50° C., ESC/Chiller: 30° C.
Endpoint setting: Delay 6 s, normal 3 s, trigger 118.
The process used for the second tungsten etchback etch (step 204) was the following:

Step 1: 30 mtorr/0 Ws/0 Wb/40 $O_2$/20 $N_2$/300 $SF_6$/8 He/Stable.
Step 2: 30 mtorr/800 Ws/35 Wb/40 $O_2$/20 $N_2$/300 $SF_6$/8 He/Endpoint time (Max 40 s)
Step 3: 35 mtorr/650 Ws/25 Wb/20 $N_2$/400 $SF_6$/8 He/25 s Chamber Wall: 50° C., ESC/Chiller: 30° C.
Endpoint setting: Delay 6 s, normal 3 s, trigger 118.

Figure 4:
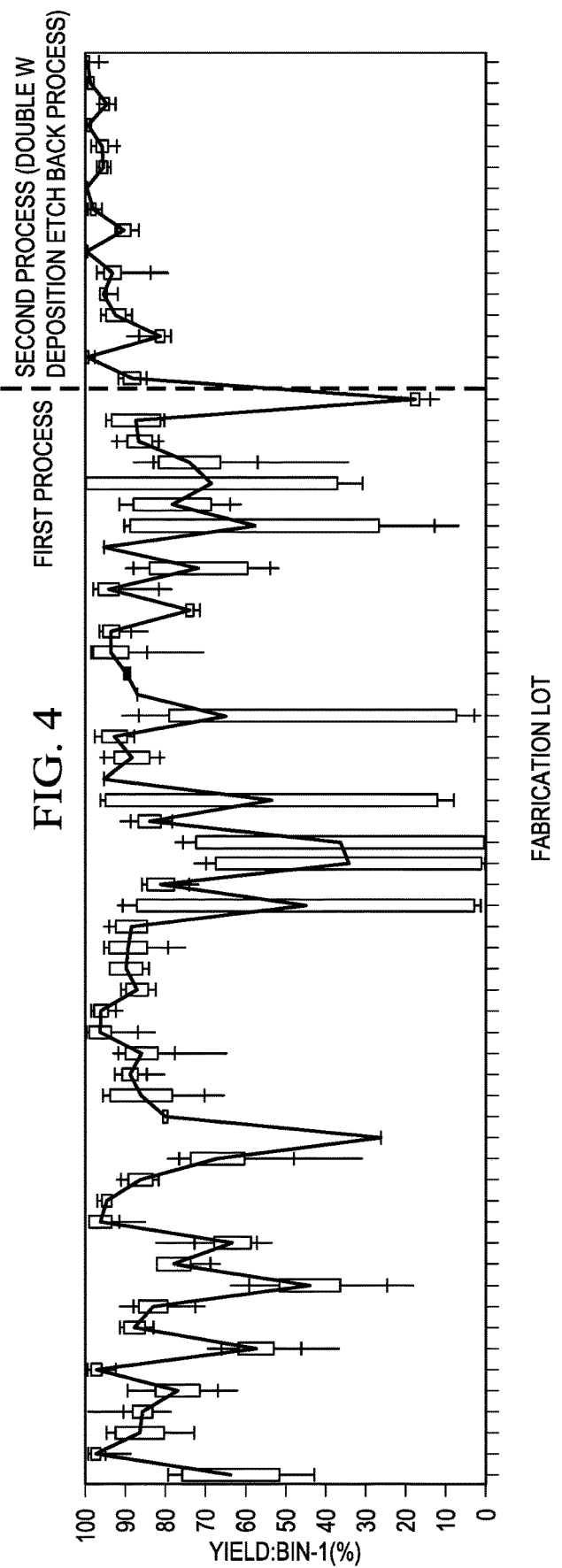
FIG. 4 shows a yield trend chart of power MOSFET device yield evidencing a yield improvement when using a disclosed double metal filler deposition/etch back method for forming deep SCTs for power MOSFETs shown as a "second process" vs. an otherwise equivalent single metal filler deposition/etch back method shown as a "first process" for forming deep SCTs for power MOSFETs.

As shown in the yield trend chart shown in FIG. 4, the power MOSFET device yield was improved for the new process based on method 200 shown as a "second process" and kept essentially stable (yield >90% of good (bin-1) die) as compared to an otherwise equivalent single metal filler deposition/etch back method shown as the "first process" having a highly variable fabrication lot yield from 50% to about 85%. The second process/method 200 is thus shown to have improved the power MOSFET device fabrication lot yield significantly from being a highly variable yield (50% to 85%) to a consistently higher yield of over 90%.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A planar gate power metal-oxide-semiconductor field effect transistor die (power MOSFET), comprising:
a substrate having a semiconductor surface layer doped a first conductivity type over a bulk substrate, the semiconductor surface layer having a top side and the bulk substrate having a backside opposite the semiconductor surface layer;
a plurality of transistor cells (cells) including a first cell and at least a second cell formed on the top side of the semiconductor surface layer, the first cell having a first gate stack and the second cell having a second gate stack;
each gate stack including a gate electrode on a gate dielectric over a body region;
a trench having an aspect ratio of at least 3 extending down from the top side of the semiconductor surface layer between the first gate stack and the second gate stack providing a source contact (SCT) from the substrate to a source doped a second conductivity type, and further comprising a substrate contact region at a bottom of the SCT, wherein the substrate contact region is doped the first conductivity type and extends from the semiconductor surface layer into the bulk substrate, the backside of the bulk substrate electrically coupled to the source;
a field plate (FP) over the first and second gate stacks extending to provide a liner for the trench;
the trench having a refractory metal or platinum-group metal (PGM) filler (metal filler) within the trench, and a drain doped the second conductivity type in the semiconductor surface layer on a side of the first gate stack opposite the trench and on a side of the second gate stack opposite the trench.

2. The power MOSFET of claim 1, wherein the metal filler comprises tungsten (W).

3. The power MOSFET of claim 1, wherein the metal filler comprises Ta, Pt, or Pd, or refractive metal silicides of the Ta, Pt, or Pd.

4. The power MOSFET of claim 1, wherein the gate electrode comprises a metal silicide ($WSi_2$) on polysilicon.

5. The power MOSFET of claim 1, wherein the FP comprises at least one refractory metal layer.

6. The power MOSFET of claim 1, wherein the bulk substrate comprises a p+ substrate and the semiconductor surface layer comprises a p-epitaxial layer, and wherein the power MOSFET comprises NMOS.

7. The power MOSFET of claim 1, wherein the bulk substrate comprises an n+ substrate and the semiconductor surface layer comprises an n-epitaxial layer, and wherein the power MOSFET comprises PMOS.

8. The power MOSFET of claim 1, wherein the FP comprises at least one refractory metal layer.

9. The device of claim 1, wherein the first gate stack and the second gate stack each include sidewall spacers and the trench is between and self-aligned to the first gate stack and second gate stack.

10. A planar power gate metal-oxide-semiconductor field effect transistor die (power MOSFET), comprising:
a substrate having a semiconductor surface doped a first conductivity type;
a plurality of transistor cells (cells) including a first cell and at least a second cell formed on the semiconductor surface, the first cell having a first gate stack and the second cell having a second gate stack;
each gate stack including a gate electrode on a gate dielectric over a body region, a trench having an aspect ratio of at least 3 extending down from a top side of the semiconductor surface between the first gate stack and the second gate stack providing a source contact (SCT) from the substrate to a source doped a second conductivity type, and a field plate (FP) over the first and second gate stacks extending to provide a liner for the trench;
the trench having a tungsten or tungsten comprising filler within the trench, the filler entirely contained within the trench and having a dielectric layer extending into the trench and covering the filler, the filler contacting the field plate within the trench and the field plate contacting the dielectric above the trench; and
a drain doped the second conductivity type in the semiconductor surface on a side of the first and second gate stacks opposite the trench.

11. The power MOSFET of claim 10, wherein the gate electrode comprises a metal silicide ($WSi_2$) on polysilicon.

12. The power MOSFET of claim 10, wherein the FP comprises at least one refractory metal layer.

13. The power MOSFET of claim 10, wherein the substrate comprises a p+ substrate and the semiconductor surface comprises a p-epitaxial layer, and wherein the power MOSFET comprises NMOS.

14. The power MOSFET of claim 10, wherein the substrate comprises an n+ substrate and the semiconductor surface comprises an n-epitaxial layer, and wherein the power MOSFET comprises PMOS.

15. The power MOSFET of claim 10, wherein the FP comprises at least one refractory metal layer.

16. The power MOSFET of claim 10, further comprising a substrate contact region at a bottom of the SCT, wherein the substrate contact region is doped the first conductivity type, the substrate comprises a bulk substrate, the semiconductor surface comprises a p-epitaxial layer on the bulk substrate, and the substrate contact region extends below the p-epitaxial layer into the bulk substrate.

17. A device including a planar gate power metal-oxide-semiconductor field effect transistor (power MOSFET), comprising:
a substrate having a semiconductor surface doped a first conductivity type;
a first gate stack and a second gate stack, the first and second gate stacks each including sidewall spacers and a gate electrode on a gate dielectric over a body region;
a trench having an aspect ratio of at least 3 extending down from a top side of the semiconductor surface between and self-aligned to the first gate stack and the second gate stack, the trench providing a source contact (SCT) from the substrate to a source doped a second conductivity type;
a field plate (FP) over the first and second gate stacks extending to provide a liner for the trench, wherein the trench has a refractory metal or platinum-group metal (PGM) filler (metal filler) within the trench, the metal filler contained entirely within the trench and the metal filler and the trench covered by a dielectric; and
a drain doped the second conductivity type in the semiconductor surface on a side of the first and second gate stacks opposite the trench.

18. The device of claim 17, wherein the metal filler comprises tungsten (W).

19. The device of claim 17, wherein the metal filler comprises Ta, Pt, or Pd, or refractive metal silicides of Ta, Pt, or Pd.

20. The device of claim 10, wherein the first gate stack and the second gate stack each include sidewall spacers and the trench is between and self-aligned to the first gate stack and second gate stack.

* * * * *